(12) United States Patent
Kishida et al.

(10) Patent No.: US 12,414,319 B2
(45) Date of Patent: Sep. 9, 2025

(54) SEMICONDUCTOR DEVICE, SEMICONDUCTOR MODULE, AND WIRELESS COMMUNICATION APPARATUS

(71) Applicant: SONY SEMICONDUCTOR SOLUTIONS CORPORATION, Kanagawa (JP)

(72) Inventors: Kazuki Kishida, Kanagawa (JP); Katsuhiko Takeuchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 426 days.

(21) Appl. No.: 18/005,058

(22) PCT Filed: Jun. 18, 2021

(86) PCT No.: PCT/JP2021/023166
§ 371 (c)(1),
(2) Date: Jan. 11, 2023

(87) PCT Pub. No.: WO2022/019017
PCT Pub. Date: Jan. 27, 2022

(65) Prior Publication Data
US 2023/0261099 A1    Aug. 17, 2023

(30) Foreign Application Priority Data
Jul. 20, 2020   (JP) .................................. 2020-123446

(51) Int. Cl.
*H10D 30/47*    (2025.01)
*H10D 30/01*    (2025.01)
(Continued)

(52) U.S. Cl.
CPC ......... *H10D 30/475* (2025.01); *H10D 30/015* (2025.01); *H10D 62/307* (2025.01); *H10D 64/514* (2025.01); *H10D 62/8503* (2025.01)

(58) Field of Classification Search
None
See application file for complete search history.

(56) References Cited

U.S. PATENT DOCUMENTS

2007/0267655 A1* 11/2007 Endoh ................. H10D 30/015
                                                     257/E29.252
2014/0159117 A1*  6/2014 Taniguchi ............ H10D 62/364
                                                     257/194
(Continued)

FOREIGN PATENT DOCUMENTS

JP    2009-246247 A    10/2009
JP    2014-057092 A     3/2014
(Continued)

OTHER PUBLICATIONS

International Search Report and Written Opinion of PCT Application No. PCT/JP2021/023166, issued on Sep. 14, 2021, 09 pages of ISRWO.

*Primary Examiner* — Khaja Ahmad
(74) *Attorney, Agent, or Firm* — CHIP LAW GROUP (57) ABSTRACT

A semiconductor device including: a channel layer; a barrier layer; a source electrode and a drain electrode; a gate electrode; a side surface opening region; and a low-Ns region. The channel layer includes a first nitride semiconductor. The barrier layer includes a second nitride semiconductor. The barrier layer is provided on the channel layer. The source electrode and the drain electrode are provided above the barrier layer. The gate electrode is provided above the barrier layer between the source electrode and the drain electrode. The side surface opening region is at least provided on one of side surfaces of the gate electrode between (Continued)

the source electrode or the drain electrode and the gate electrode. The low-Ns region is provided in the channel layer in correspondence with a planar region provided with the gate electrode and the side surface opening region. The low-Ns region has lower carrier density than carrier density of another region of the channel layer.

13 Claims, 8 Drawing Sheets

(51) Int. Cl.
  *H10D 62/17* (2025.01)
  *H10D 62/85* (2025.01)
  *H10D 64/27* (2025.01)

(56) References Cited

U.S. PATENT DOCUMENTS

2015/0243774 A1* 8/2015 Endoh ............... H10D 30/4735
  257/194
2016/0225885 A1* 8/2016 Takeuchi ............ H10D 62/824

FOREIGN PATENT DOCUMENTS

| JP | 2014-241350 A | 12/2014 |
| JP | 2017-092083 A | 5/2017 |
| WO | 2019/176434 A1 | 9/2019 |

* cited by examiner

SEMICONDUCTOR DEVICE, SEMICONDUCTOR MODULE, AND WIRELESS COMMUNICATION APPARATUS

CROSS REFERENCE TO RELATED APPLICATIONS

This application is a U.S. National Phase of International Patent Application No. PCT/JP2021/023166 filed on Jun. 18, 2021, which claims priority benefit of Japanese Patent Application No. JP 2020-123446 filed in the Japan Patent Office on Jul. 20, 2020. Each of the above-referenced applications is hereby incorporated herein by reference in its entirety.

TECHNICAL FIELD

The present disclosure relates to a semiconductor device, a semiconductor module, and a wireless communication apparatus.

BACKGROUND ART

In recent years, high electron mobility transistors (High Electron Mobility Transistors: HEMTs) have been proposed that each use a two-dimensional electron gas layer formed at a heterojunction interface between compound semiconductors as a channel.

A two-dimensional electron gas layer has high electron mobility and high sheet electron density. HEMT that uses the two-dimensional electron gas layer as a channel is promising as a low-resistance and high-withstand-voltage transistor that is able to perform a high-speed operation. For example, the HEMT is expected to be applied to a power device, an RF (Radio Frequency) device, or the like.

For example, HEMT having a MIS (Metal-Insulator-Semiconductor) structure has been proposed in which a compound semiconductor layer and a gate metal are bonded with a gate insulating film interposed in between (e.g., PTL 1). The HEMT having a MIS structure includes the gate insulating film at the interface between the compound semiconductor layer and the gate and gate leak is suppressed during an off operation. This makes it possible to reduce power consumption. Therefore, the HEMT having a MIS structure is expected to be suitable for a portable wireless communication apparatus.

CITATION LIST

Patent Literature

PTL 1: Japanese Unexamined Patent Application Publication No. 2017-92083

SUMMARY OF THE INVENTION

In general, thinning down the gate insulating film allows the transistor having a MIS structure to achieve a higher-speed operation. Meanwhile, thinning down the gate insulating film causes the dielectric voltage of the gate insulating film to decrease. This may decrease the gate withstand voltage during an off operation.

In the MIS-type HEMT, the two-dimensional electron gas layer serving as a channel has high carrier density. The gate insulating film thus receives a higher electric field more easily. The HEMT is therefore requested to have a higher gate withstand voltage.

It is desirable to provide a semiconductor device having higher withstand voltage performance and a semiconductor module and a wireless communication apparatus each including the semiconductor device.

A semiconductor device according to an embodiment of the present disclosure includes: a channel layer; a barrier layer; a source electrode and a drain electrode; a gate electrode; a side surface opening region; and a low-Ns region. The channel layer includes a first nitride semiconductor. The barrier layer includes a second nitride semiconductor. The barrier layer is provided on the channel layer. The source electrode and the drain electrode are provided above the barrier layer. The gate electrode is provided above the barrier layer between the source electrode and the drain electrode. The side surface opening region is at least provided on one of side surfaces of the gate electrode between the source electrode or the drain electrode and the gate electrode. The low-Ns region is provided in the channel layer in correspondence with a planar region provided with the gate electrode and the side surface opening region. The low-Ns region has lower carrier density than carrier density of another region of the channel layer.

A semiconductor module according to an embodiment of the present disclosure includes a semiconductor device. The semiconductor device includes a channel layer, a barrier layer, a source electrode and a drain electrode, a gate electrode, a side surface opening region, and a low-Ns region. The channel layer includes a first nitride semiconductor. The barrier layer includes a second nitride semiconductor. The barrier layer is provided on the channel layer. The source electrode and the drain electrode are provided above the barrier layer. The gate electrode is provided above the barrier layer between the source electrode and the drain electrode. The side surface opening region is at least provided on one of side surfaces of the gate electrode between the source electrode or the drain electrode and the gate electrode. The low-Ns region is at least provided in the channel layer corresponding to a planar region provided with the gate electrode and the side surface opening region. The low-Ns region has lower carrier density than carrier density of another region of the channel layer.

A wireless communication apparatus according to an embodiment of the present disclosure includes a semiconductor device. The semiconductor device includes a channel layer, a barrier layer, a source electrode and a drain electrode, a gate electrode, a side surface opening region, and a low-Ns region. The channel layer includes a first nitride semiconductor. The barrier layer includes a second nitride semiconductor. The barrier layer is provided on the channel layer. The source electrode and the drain electrode are provided above the barrier layer. The gate electrode is provided above the barrier layer between the source electrode and the drain electrode. The side surface opening region is at least provided on one of side surfaces of the gate electrode between the source electrode or the drain electrode and the gate electrode. The low-Ns region is at least provided in the channel layer corresponding to a planar region provided with the gate electrode and the side surface opening region. The low-Ns region has lower carrier density than carrier density of another region of the channel layer.

In the semiconductor device, the semiconductor module, and the wireless communication apparatus according to the respective embodiments of the present disclosure, it is possible to control the polarization or the like of the barrier layer exposed by the gate opening provided with the gate electrode and the side surface opening region at least provided on one of the side surfaces of the gate electrode. This makes it possible to form the low-Ns region having reduced carrier density in the channel layer corresponding to the barrier layer.

MODES FOR CARRYING OUT THE INVENTION

The following describes embodiments of the present disclosure in detail with reference to the drawings. The embodiments described below are specific examples of the present disclosure. The technology according to the present disclosure is not limited to the following modes. In addition, the disposition, dimensions, dimensional ratios, and the like of the respective components according to the present disclosure are not limited to the modes illustrated in the drawings.

It is to be noted that description is given in the following order.
1. First Embodiment
1.1. Configuration Example
1.2. Manufacturing Method
2. Second Embodiment
3. Third Embodiment

1. FIRST EMBODIMENT (1.1. Configuration Example)

Figure 1:
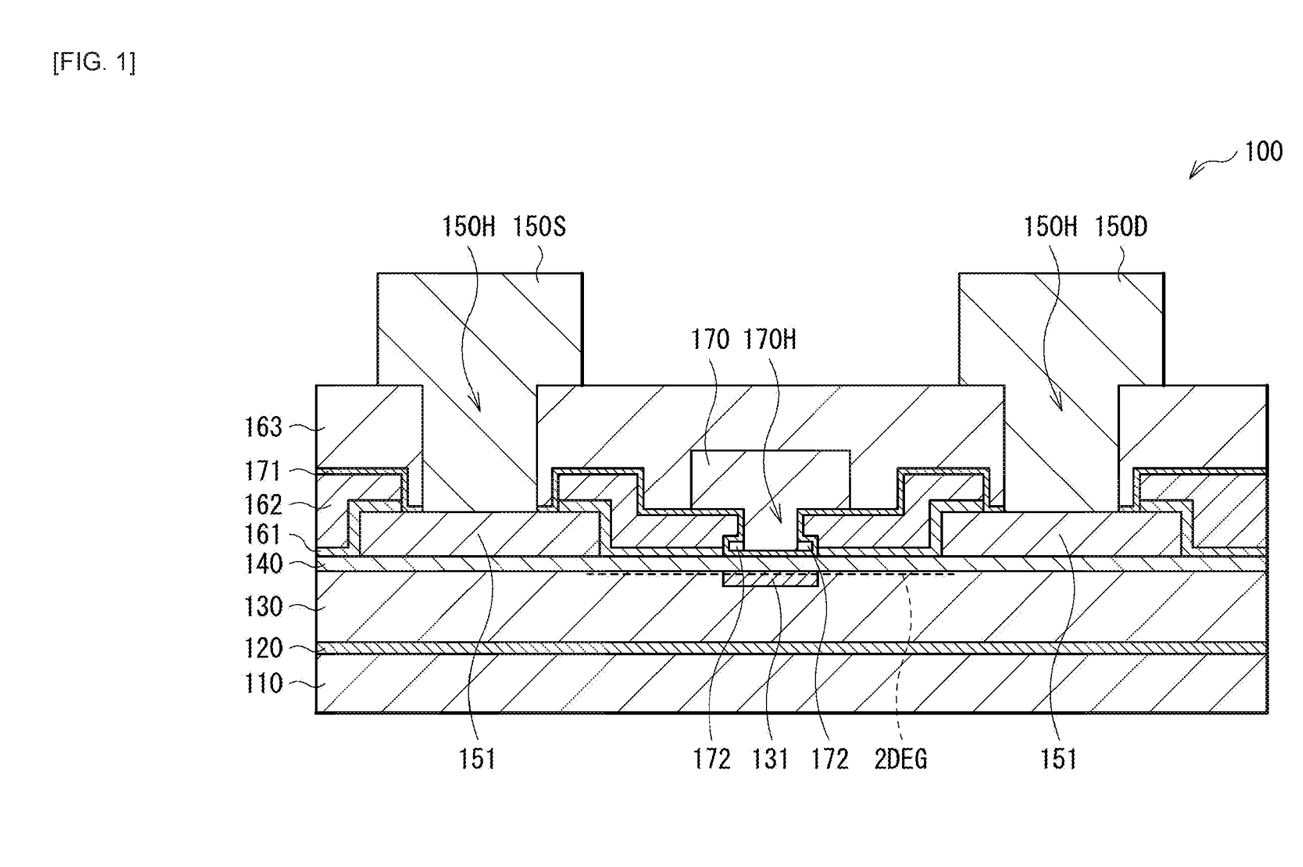
FIG. 1 is a vertical cross-sectional view of a configuration of a semiconductor device according to an embodiment of the present disclosure.
Figure 2:
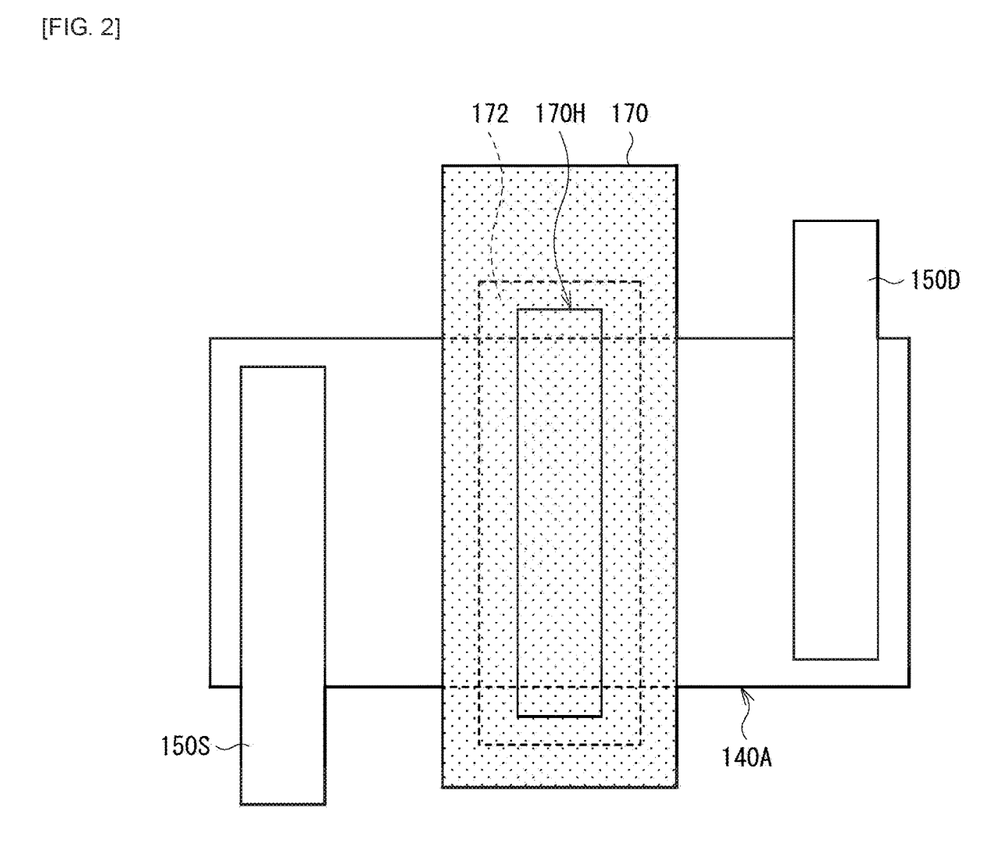
FIG. 2 is a top view of the configuration of the semiconductor device according to the embodiment.

First, a configuration of a semiconductor device according to a first embodiment of the present disclosure is described with reference to FIGS. 1 and 2. FIG. 1 is a vertical cross-sectional view of a configuration of a semiconductor device 100 according to the present embodiment. FIG. 2 is a top view of the configuration of the semiconductor device 100 according to the present embodiment.

As illustrated in FIG. 1, the semiconductor device 100 includes a substrate 110, a buffer layer 120, a channel layer 130, a low-Ns region 131, a barrier layer 140, an ohmic layer 151, a source electrode 150S, a drain electrode 150D, a first insulating layer 161, a second insulating layer 162, a third insulating layer 163, a gate electrode 170, a gate insulating film 171, and a side surface opening region 172.

In other words, the semiconductor device 100 is a high electron mobility transistor (HEMT) that uses a two-dimensional electron gas layer (2DEG) as a channel. The two-dimensional electron gas layer (2DEG) is formed by using the difference between the magnitude of the polarization of the channel layer 130 and the magnitude of the polarization of the barrier layer 140. The two-dimensional electron gas layer is formed, for example, in the channel layer 130 near the barrier layer 140.

The substrate 110 is a supporting body of the semiconductor device 100. Specifically, the substrate 110 may be a substrate including a semiconductor material having a lattice constant close to that of the nitride semiconductor included in the channel layer 130. For example, the substrate 110 may be a substrate including a III-V group compound semiconductor such as a single-crystal GaN substrate.

It is to be noted that the semiconductor device 100 is provided with the buffer layer 120 and it is thus also possible to use, as the substrate 110, a substrate including a material having a lattice constant different from that of the channel layer 130. For example, the substrate 110 may be a SiC substrate, a sapphire substrate, a Si substrate, or the like.

The buffer layer 120 is a nitride semiconductor layer epitaxially grown on the substrate 110. Control over the lattice constant of the surface provided with the channel layer 130 allows the buffer layer 120 to reduce the lattice mismatch between the substrate 110 and the channel layer 130. This allows the buffer layer 120 to offer a more favorable crystal state for the channel layer 130 and suppress the warpage of the substrate 110. For example, in a case where the substrate 110 is a single-crystal Si substrate and the channel layer 130 is a GaN layer, the buffer layer 120 may include AlN, AlGaN, or GaN. However, depending on the configurations of the substrate 110 and the channel layer 130, the buffer layer 120 may be omitted.

The buffer layer 120 may be provided to have a monolayer structure. Alternatively, the buffer layer 120 may be provided to have a multilayer structure in which a plurality of layers of AlN, AlGaN, or GaN is stacked. In addition, in a case where the buffer layer 120 includes a ternary material such as AlGaN, the buffer layer 120 may be provided to gradually change in composition in the thickness direction.

The channel layer 130 includes a nitride semiconductor having a narrower band gap than that of the barrier layer 140. The channel layer 130 allows carriers to be accumulated on the channel layer 130 side near the interface between the channel layer 130 and the barrier layer 140 by using the difference from the magnitude of the polarization of the barrier layer 140. For example, the channel layer 130 may include epitaxially grown GaN. In addition, the channel layer 130 may include undoped u-GaN to which no impurity is added. In such a case, the channel layer 130 makes it possible to suppress the impurity scattering of the carriers. It is thus possible to increase the carrier mobility.

The barrier layer 140 includes a nitride semiconductor having a wider band gap than that of the channel layer 130. The barrier layer 140 bonded to the channel layer 130 allows carriers to be accumulated in the channel layer 130 near the barrier layer 140 by spontaneous polarization or piezoelectric polarization. This forms a two-dimensional electron gas layer (2DEG) having high mobility and high carrier concentration in the channel layer 130 near the barrier layer 140.

For example, the barrier layer 140 may include epitaxially grown $Al_{1-x-y}Ga_xIn_yN$ (where $0 \leq x < 1$ and $0 \leq y < 1$). In addition, the barrier layer 140 may include undoped u-$Al_{1-x-y}Ga_xIn_yN$ to which no impurity is added. In such a case, the barrier layer 140 makes it possible to suppress the impurity scattering of the carriers in the channel layer 130. It is possible to further increase the carrier mobility.

It is to be noted that the barrier layer 140 may include a single layer. Alternatively, the barrier layer 140 may include a plurality of stacked layers of $Al_{1-x-y}Ga_xIn_yN$ that is different in composition. In addition, the barrier layer 140 may be configured to gradually change in composition in the thickness direction.

The low-Ns region 131 is a region that is provided in a partial region of the channel layer 130 and has lower carrier density than that of the other regions of the channel layer 130. Specifically, the low-Ns region 131 is provided in the partial region of the channel layer 130 corresponding to the planar region provided with the gate electrode 170 and the side surface opening regions 172. The low-Ns region 131 functions as a portion of the current path between the drain electrode 150D and the source electrode 150S.

The carrier density of the low-Ns region 131 is reduced as compared with that of the other regions of the channel layer 130. This makes it possible to suppress the application of an excessive electric field to the gate insulating film 171 between the low-Ns region 131 and the gate electrode 170. In addition, the low-Ns region 131 is provided to be wider from the gate electrode 170 by the side surface opening regions 172. This makes it possible to suppress the occurrence of the concentration of an electric field at the end of the gate electrode 170. This allows the low-Ns region 131 to increase the withstand voltage performance of the semiconductor device 100.

In addition, as illustrated in FIG. 2, there is provided an active region 140A in the stacked structure of the substrate 110, the buffer layer 120, the channel layer 130, and the barrier layer 140. The active region 140A is surrounded by an insulative element isolation region.

The active region 140A is a region provided with the respective components of the semiconductor device 100. The active region 140A is provided as an island-shaped region surrounded by the element isolation region. The element isolation region is provided by inactivating the channel layer 130 and the barrier layer 140 by implanting ions such as B (boron). The element isolation region is provided to surround the active region 140A and electrically isolates the active regions 140A from each other. It is to be noted that the element isolation region may be formed by removing the channel layer 130 and the barrier layer 140 by etching.

The active region 140A is provided with the source electrode 150S and the drain electrode 150D in the extending direction of the active region 140A. The active region 140A is provided with the gate electrode 170 between the source electrode 150S and the drain electrode 150D. Specifically, the source electrode 150S and the drain electrode 150D may be provided to protrude to the opposite sides in the direction orthogonal to the extending direction of the active region 140A. The gate electrode 170 may be provided to cross the active region 140A in the direction orthogonal to the extending direction of the active region 140A.

The ohmic layers 151 are provided on both sides of the gate electrode 170 on the barrier layer 140. Each of the ohmic layers 151 forms an ohmic contact with the barrier layer 140 through heat treatment. This makes it possible to reduce the contact resistance between the source electrode 150S and the drain electrode 150D provided in the upper layer, and the two-dimensional electron gas layer (2DEG). The ohmic layer 151 may be provided to have a structure in which, for example, Ti (titanium), Al (aluminum), Ni (nickel), and Au (gold) are sequentially stacked from the barrier layer 140 side.

The source electrode 150S and the drain electrode 150D are provided on the ohmic layers 151 provided on both sides of the gate electrode 170. It is possible to electrically couple the source electrode 150S and the drain electrode 150D to the two-dimensional electron gas layer (2DEG) in the channel layer 130 through the ohmic layers 151. The source electrode 150S and the drain electrode 150D may be each provided to have a structure in which Ti (titanium), Al (aluminum), Ni (nickel), and Au (gold) are sequentially stacked from the ohmic layer 151 side.

It is to be noted that there may be provided a regrowth layer below each of the ohmic layers 151. The regrowth layer is provided, for example, by digging the barrier layer 140 and the channel layer 130 from the barrier layer 140 side to a region deeper than the interface between the barrier layer 140 and the channel layer 130 and filling the dug region with an n-type nitride semiconductor.

Specifically, the regrowth layer may be provided selectively growing a nitride semiconductor including an n-type impurity epitaxially in each of the regions corresponding to the source and the drain by using a selection mask. Alternatively, the regrowth layer may be provided epitaxially growing a nitride semiconductor including an n-type impurity on the entire surface and then removing the deposit on the mask.

Each of the regrowth layers has higher electrical conductivity than that of the barrier layer 140. This makes it possible to electrically couple the source electrode 150S and the drain electrode 150D, and the two-dimensional electron gas layer (2DEG) with lower resistance. For example, the regrowth layer may include GaN including an n-type impurity such as Si or Ge at $1.0 \times 10^{19}/cm^3$ or more. Alternatively, the regrowth layer may include $In_{1-x}Ga_xN$ ($0 \leq x < 1$), which is easier than GaN to grow at a low temperature.

The first insulating layer 161 is provided by using an insulative material to cover the barrier layer 140 and the ohmic layers 151. Specifically, the first insulating layer 161 is provided by using a material having an insulation property with respect to the barrier layer 140, the ohmic layers 151, and the gate electrode 170. This allows the first insulating layer 161 to protect the surface of the barrier layer 140 from an impurity such as ions and suppress a decrease in the characteristics of the semiconductor device 100 by offering a favorable interface with the barrier layer 140. For example, the first insulating layer 161 may include a film of $Al_2O_3$ that has a film thickness of about 50 nm.

In addition, the first insulating layer 161 is provided with openings 150H for providing the source electrode 150S and the drain electrode 150D and a gate opening 170H for providing the gate electrode 170. To allow the side surface opening regions 172 described below to be provided, the gate opening 170H provided in the first insulating layer 161 is provided to have a greater width than that of the gate opening 170H provided in the second insulating layer 162.

The second insulating layer 162 is provided by using an insulative material to cover the first insulating layer 161. The second insulating layer 162 is provided by using a material having an insulation property with respect to the first insulating layer 161, the gate electrode 170, and the gate insulating film 171. This allows the second insulating layer 162 to protect the surface of the barrier layer 140 from an impurity such as ions. For example, the second insulating layer 162 may include a film of $SiO_2$ that has a film thickness of about 100 nm.

In addition, the second insulating layer 162 is provided with the openings 150H for providing the source electrode 150S and the drain electrode 150D and the gate opening 170H for providing the gate electrode 170. The gate opening 170H provided in the second insulating layer 162 has a smaller width than that of the gate opening 170H provided in the first insulating layer 161. The second insulating layer 162 is therefore provided to protrude from the first insulating layer 161 inside the gate opening 170H.

The gate insulating film 171 is uniformly provided by using an insulative material on the second insulating layer 162 along the shapes of the openings 150H and the gate opening 170H. Specifically, the gate insulating film 171 is uniformly provided on the top of the second insulating layer 162, the inner side surfaces of the openings 150H provided in the first insulating layer 161 and the second insulating layer 162, and the inner side surfaces and the inner bottom surface of the gate opening 170H. The gate insulating film 171 is provided by using a material having an insulation property with respect to the barrier layer 140 and the gate electrode 170. This allows the gate insulating film 171 to protect the surface of the barrier layer 140 from an impurity such as ions and suppress a decrease in the characteristics of the semiconductor device 100 by offering a favorable interface with the barrier layer 140. For example, the gate insulating film 171 may be provided as a single layer film or a stacked film of $Al_2O_3$ or $HfO_2$ that has a film thickness of about 10 nm.

The gate electrode 170 is provided by using an electrically conductive material on the gate insulating film 171 inside the gate opening 170H. Specifically, the gate electrode 170 is provided on the gate insulating film 171 on the barrier layer 140 from the top of the second insulating layer 162 through the gate opening 170H. For example, the gate electrode 170 may be provided by stacking Ni (nickel) and Au (gold) from the gate insulating film 171 side.

The gate electrode 170 makes it possible to control the carrier concentration of the two-dimensional electron gas layer (2DEG) formed in the channel layer 130 by using an applied voltage. Specifically, the gate electrode 170 makes it possible to control the carrier concentration of the two-dimensional electron gas layer (2DEG) formed in the channel layer 130 with an electric field effect by controlling the thickness of a depletion layer formed in the barrier layer 140 below with an application voltage.

The side surface opening region 172 is at least provided on one of the side surfaces of the gate electrode 170 between the source electrode 150S or the drain electrode 150D and the gate electrode 170 as a side surface opening for the first insulating layer 161. The side surface opening region 172 allows the low-Ns region 131 to be formed in the channel layer 130 by processing the barrier layer 140 through the side surface opening region 172 and the gate opening 170H. In other words, the low-Ns region 131 is provided in the channel layer 130 in the planar region provided with the side surface opening region 172 and the gate electrode 170.

For example, the low-Ns region 131 may be formed by recessing the barrier layer 140 exposed by the side surface opening region 172 and the gate opening 170H, adding fixed electric charge to the exposed barrier layer 140, or doping the exposed barrier layer 140 with anions.

The side surface opening region 172 may be at least provided on the side surface of the gate electrode 170 between the drain electrode 150D and the gate electrode 170. The concentration of an electric field at the end of the gate electrode 170 is likely to occur on the drain electrode 150D side. The formation of the low-Ns region 131 on the drain electrode 150D side therefore allows the side surface opening region 172 to increase the withstand voltage performance at the end of the gate electrode 170.

In addition, the respective side surface opening regions 172 may be provided on both of the side surfaces of the gate electrode 170 between the source electrode 150S and the drain electrode 150D, and the gate electrode 170. This allows the side surface opening regions 172 to further increase the withstand voltage performance at the end of the gate electrode 170 by forming the low-Ns regions 131 on the respective sides of the source electrode 150S and the drain electrode 150D.

It is to be noted that, in such a case, the side surface opening region 172 provided on the drain electrode 150D side may be provided to have a greater width than that of the side surface opening region 172 provided on the source electrode 150S side. As described above, the concentration of an electric field at the end of the gate electrode 170 is likely to occur on the drain electrode 150D side. Therefore, in a case where the side surface opening region 172 on the drain electrode 150D side and the low-Ns region 131 are each provided to have a greater width, the semiconductor device 100 is allowed to have further higher withstand voltage performance.

In addition, as illustrated in FIG. 2, the side surface opening region 172 may be provided over the entire circumference of the side surfaces of the gate electrode 170. For example, the side surface opening region 172 is formed by forming the gate opening 170H by dry etching and removing the side surfaces of the first insulating layer 161 exposed by the gate opening 170H by wet etching. The gate opening 170H extends through the first insulating layer 161 and the second insulating layer 162. In such a case, the wet etching proceeds isotropically. This causes the side surface opening region 172 to be provided to extend from the gate opening 170H on the entire circumference. The side surface opening region 172 allows the low-Ns region 131 to be formed in the active region 140A immediately below the side surface opening region 172 and it is thus possible to suppress the application of an excessive electric field and the concentration of an electric field between the low-Ns region 131 and the gate electrode 170.

The third insulating layer 163 is provided by using an insulative material on the gate insulating film 171. The third insulating layer 163 is provided by using a material having an insulation property with respect to the source electrode 150S, the drain electrode 150D, and the gate electrode 170. For example, the third insulating layer 163 may include $SiO_2$, $Si_3N_4$, or the like. It is to be noted that the third insulating layer 163 is provided with the openings 150H for providing the source electrode 150S and the drain electrode 150D.

As described above, the semiconductor device 100 according to the present embodiment is provided with the low-Ns region 131 having reduced carrier density in the partial region of the channel layer 130. This makes it possible to increase the gate withstand voltage of the semiconductor device 100.

It is possible to set as appropriate, by the specifications of the semiconductor device 100, the size of the low-Ns region 131 and the degree to which the carrier density of the low-Ns region 131 is reduced. However, further enlarging the low-Ns region 131 and further reducing the carrier density of the low-Ns region 131 may increase the on-resistance of the semiconductor device 100 while allowing the semiconductor device 100 to have higher withstand voltage performance.

Figure 3:
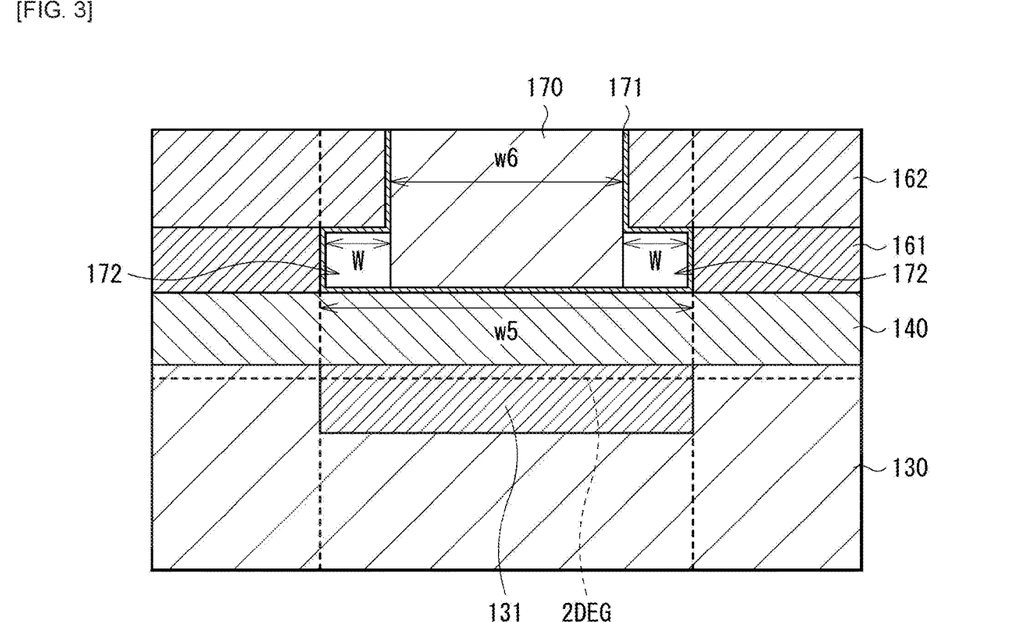
FIG. 3 is an enlarged vertical cross-sectional view of a region near a gate electrode and a side surface opening region in FIG. 1.
Figure 4:
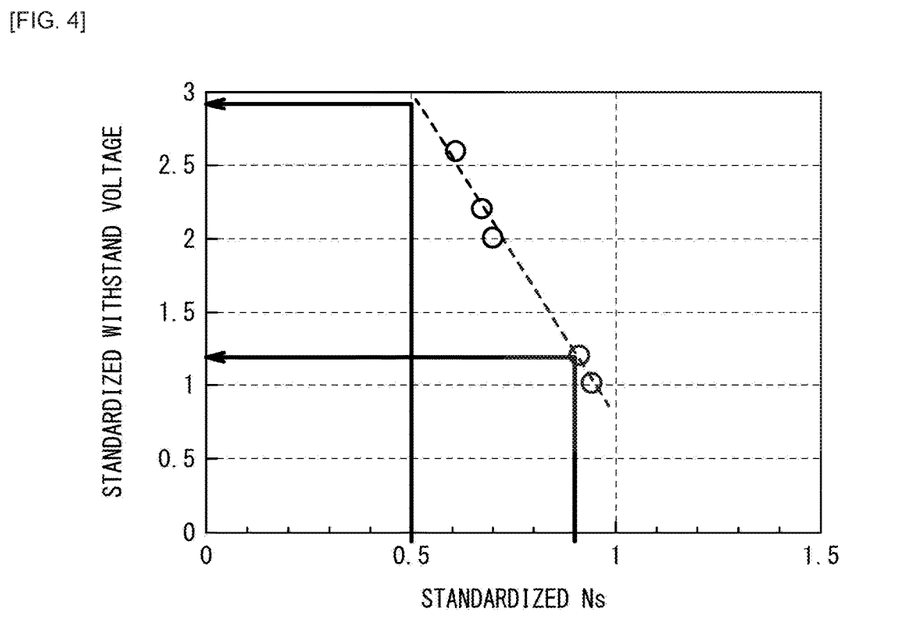
FIG. 4 is a graphical chart illustrating a relationship between carrier density of a low-Ns region and a withstand voltage of the semiconductor device.

With reference to FIGS. 3 and 4, the following specifically describes the favorable size of the low-Ns region 131 and the favorable degree to which the carrier density of the low-Ns region 131 is reduced, which allows the semiconductor device 100 to favorably achieve both the withstand voltage performance and the on-resistance.

(Favorable Size of Low-Ns Region 131)

FIG. 3 is an enlarged vertical cross-sectional view of a region near the gate electrode 170 and the side surface opening regions 172 in FIG. 1. In a case where a gate length w6 of the gate electrode 170 is Lg, it is preferable that the side surface opening regions 172 each have a width w of 0.3 Lg or more and 0.4 Lg or less from the gate electrode 170 and the low-Ns region 131 have a width w5 of 1.6 Lg or more and 1.8 Lg or less as illustrated in FIG. 3. In particular, in a case where the barrier layer 140 includes AlInN having an In concentration of 19%, providing the side surface opening regions 172 and the low-Ns region 131 with the widths within the ranges described above makes it possible to prevent the on-resistance of the semiconductor device 100 from excessively increasing while increasing the withstand voltage performance.

Alternatively, it is preferable that the side surface opening regions 172 each have a width w of 100 nm or less from the gate electrode 170 and it is preferable that the low-Ns region 131 be provided in a region that protrudes to both the source electrode 150S side and the drain electrode 150D side from the gate electrode 170 within a range of 100 nm or less. In particular, in a case where the barrier layer 140 includes AlInN having an In concentration of 19%, providing the side surface opening regions 172 with the widths within the range described above and forming the low-Ns region 131 within an appropriate range make it possible to prevent the on-resistance of the semiconductor device 100 from excessively increasing while increasing the withstand voltage performance. It is to be noted that the lower limit value of the width of each of the side surface opening regions 172 is not particularly limited, but the width of the side surface opening region 172 may have a lower limit value of 10 nm from the perspective of formation difficulty and cost. (Favorable Degree to Which Carrier Density of Low-Ns Region 131 Is Reduced)

As described above, it is possible to set as appropriate, in accordance with the specifications of the semiconductor device 100, the degree to which the carrier density of the low-Ns region 131 is reduced. However, it is preferable that the carrier density of the low-Ns region 131 be 50% or more and 90% or less of the carrier density of the other regions of the channel layer 130. In such a case, the semiconductor device 100 is allowed to have higher withstand voltage performance and have an excessive increase in on-resistance suppressed.

FIG. 4 is a graphical chart illustrating a relationship between the carrier density (Ns) of the low-Ns region 131 and the withstand voltage of the semiconductor device 100. FIG. 4 illustrates results of the measurement of the withstand voltages of the respective semiconductor devices 100 manufactured by fluctuating the carrier density (Ns) of the low-Ns region 131 by using values obtained by standardizing, as 1, the carrier density and the withstand voltage of the semiconductor device 100 including the low-Ns region 131 having the highest carrier density.

It is to be noted that the withstand voltage is indicated as a gate voltage obtained in a case where a drain current Id and a gate voltage Vg of the semiconductor device 100 are evaluated and the Id waveform exceeds the threshold value. For example, the gate voltage obtained in a case where the drain current Id exceeds $1 \times 10^{-6}$ mA/mm with a drain voltage Vd fixed at 0.1 V and the gate voltage Vg scanned in the off direction is indicated as a withstand voltage.

As illustrated in FIG. 4, the withstand voltage of the semiconductor device 100 is increased by reducing the carrier density of the low-Ns region 131 by 10%. In addition, it is indicated that the withstand voltage of the semiconductor device 100 is increased up to about three times by reducing the carrier density of the low-Ns region 131 by 50%. As indicated by the graphical chart illustrated in FIG. 4, the withstand voltage of the semiconductor device 100 linearly increases as the carrier density of the low-Ns region 131 is reduced. Even as compared with the other regions of the channel layer 130, it is thus considered that the low-Ns region 131 similarly allows the semiconductor device 100 to have a higher withstand voltage by reducing the carrier density from that of the other regions of the channel layer 130 by 10% or more and 50% or less.

It is thus preferable that the low-Ns region 131 have carrier density corresponding to 50% or more and 90% or less of that of the other regions of the channel layer 130. This allows the semiconductor device 100 to have higher withstand voltage performance and have an excessive increase in on-resistance suppressed. In particular, in a case where the barrier layer 140 includes AlInN having an In concentration of 19%, the carrier density of the low-Ns region 131 within the range described above allows the semiconductor device 100 to achieve both the withstand voltage and the on-resistance more favorably.

(1.2. Manufacturing Method)

Subsequently, a method of manufacturing the semiconductor device 100 according to the present embodiment is described with reference to FIGS. 5A, 5B, 5C, 5D, 5E, 5F, and 5G. Each of FIGS. 5A, 5B, 5C, 5D, 5E, 5F, and 5G is a vertical cross-sectional view describing a step of the method of manufacturing the semiconductor device 100 according to the present embodiment.

Figure 5A:
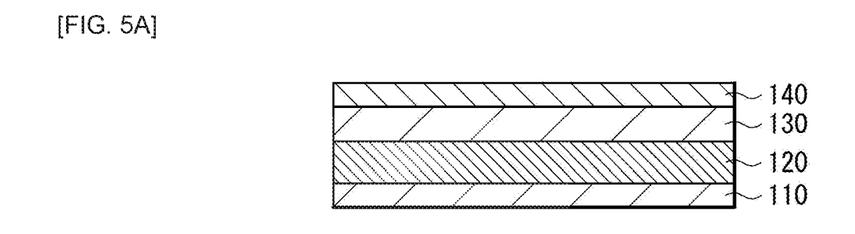
FIG. 5A is a vertical cross-sectional view describing a step of a method of manufacturing the semiconductor device according to the embodiment.

First, as illustrated in FIG. 5A, for example, the buffer layer 120 is epitaxially grown on the substrate 110 including Si or the like and GaN is then epitaxially grown to form the channel layer 130. Subsequently, AlGaN ($Al_{0.3}$-$Ga_{0.7}$N mixed crystal) is epitaxially grown on the channel layer 130 to form the barrier layer 140.

After that, the unillustrated ohmic layers 151 are formed and the unillustrated element isolation region is formed.

Specifically, the ohmic layers 151 are formed on the barrier layer 140 on both sides of a region in which the gate electrode 170 is formed in a subsequent step. Performing annealing treatment forms the ohmic layers 151 that are electrically coupled to the barrier layer 140 with low contact resistance. It is also possible to provide a regrowth layer below each of the ohmic layers 151. The regrowth layer is obtained by selectively growing an n-type nitride semiconductor.

In addition, B (boron) is ion-implanted into predetermined planar regions of the barrier layer 140 and the channel layer 130 to form an element isolation region in which the resistance of the barrier layer 140 and the channel layer 130 is increased. The element isolation region is formed, for example, to surround the island-shaped active region 140A and electrically isolates the active regions 140A from each other. The element isolation region may be formed at any timing such as a timing after the formation of the gate electrode 170.

Figure 5B:
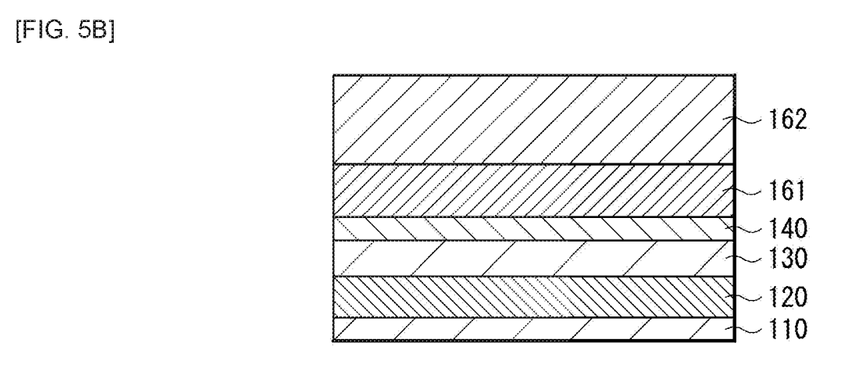
FIG. 5B is a vertical cross-sectional view describing a step of the method of manufacturing the semiconductor device according to the embodiment.

Subsequently, as illustrated in FIG. 5B, $Al_2O_3$ (aluminum oxide) is deposited on the barrier layer 140 by using an ALD (Atomic Layer Deposition) method to form the first insulating layer 161. Further, $SiO_2$ (silicon oxide) is deposited on the first insulating layer 161 by using a CVD (Chemical Vapor Deposition) method to form the second insulating layer 162.

Figure 5C:
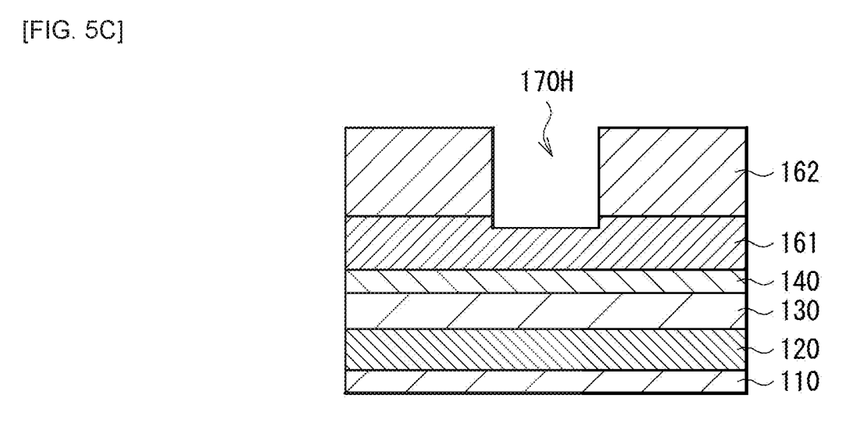
FIG. 5C is a vertical cross-sectional view describing a step of the method of manufacturing the semiconductor device according to the embodiment.

Next, as illustrated in FIG. 5C, the second insulating layer 162 is etched to form the gate opening 170H that exposes the first insulating layer 161. In this case, the use of dry etching allows the gate opening 170H to be formed with an increase in opening width suppressed more.

It is to be noted that, in a case where the second insulating layer 162 is etched to excessively etch the first insulating layer 161, the barrier layer 140 may be damaged in a subsequent process. In a case where the etching selectivity between the first insulating layer 161 and the second insulating layer 162 is 1 or more, preferably 5 or more, the excessive etching of the first insulating layer 161 is suppressed. This makes it possible to suppress damage to the barrier layer 140.

Figure 5D:
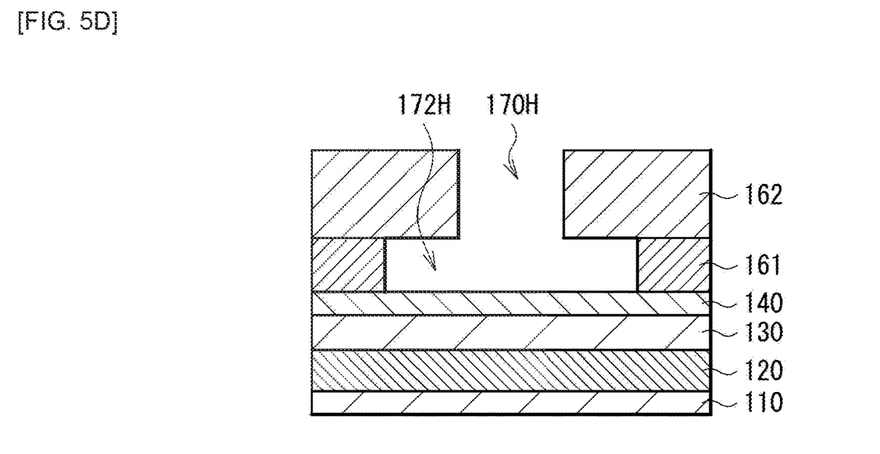
FIG. 5D is a vertical cross-sectional view describing a step of the method of manufacturing the semiconductor device according to the embodiment.

Subsequently, as illustrated in FIG. 5D, the first insulating layer 161 is subjected to wet etching to form a side surface opening 172H on the side surfaces of the first insulating layer 161 exposed by the gate opening 170H. In a case where the etching selectivity between the first insulating layer 161 and the second insulating layer 162 is then 1 or more, preferably 5 or more, it is possible to suppress the procession of etching in the second insulating layer 162 while causing etching to proceed in the side surface direction of the first insulating layer 161. This makes it possible to suppress the wet etching of the first insulating layer 161 increasing the opening width of the gate opening 170H formed in the second insulating layer 162.

Figure 5E:
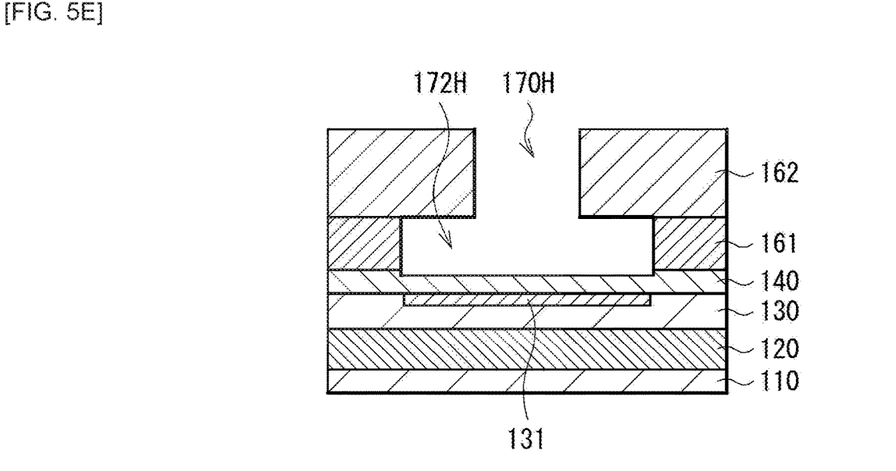
FIG. 5E is a vertical cross-sectional view describing a step of the method of manufacturing the semiconductor device according to the embodiment.

Next, as illustrated in FIG. 5E, the barrier layer 140 exposed by the gate opening 170H and the side surface opening 172H is recessed (retracted) to form the low-Ns region 131 in the channel layer 130. Specifically, it is possible to weaken the self-polarization (a mixture of self-polarization and piezoelectric polarization depending on a material) of the barrier layer 140 by recessing the barrier layer 140. This makes it possible to reduce the density of carriers accumulated in the channel layer 130 in accordance with the difference between the magnitude of the polarization of the channel layer 130 and the magnitude of the polarization of the barrier layer 140. This makes it possible to form the low-Ns region 131 in the channel layer 130 in the region obtained by recessing the barrier layer 140. It is to be noted that it is possible to recess the barrier layer 140, for example, by oxidating the barrier layer 140 and performing wet etching on the barrier layer 140.

In the method described above, it is possible to form the low-Ns region 131 with no mask or the like added because the low-Ns region 131 is formed in the channel layer 130 by using the gate opening 170H and the side surface opening 172H. It is to be noted that an end of the low-Ns region 131 may align with an end of the side surface opening 172H. Alternatively, an end of the low-Ns region 131 may extend outward from an end of the side surface opening 172H.

Figure 5F:
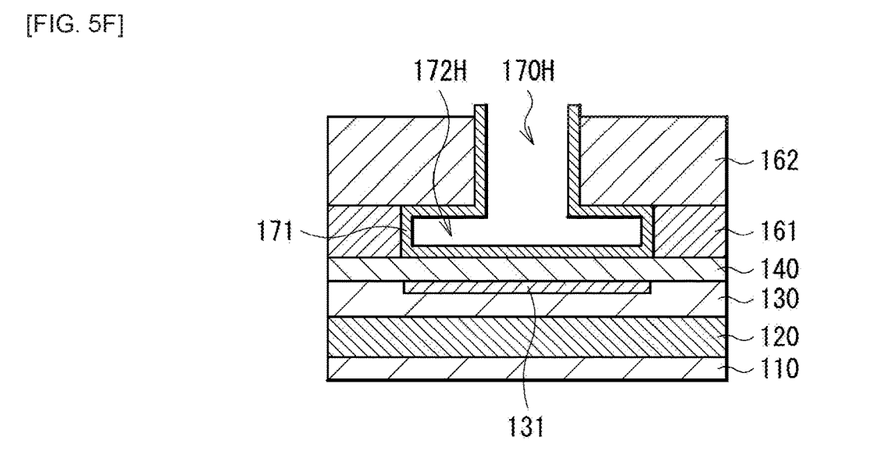
FIG. 5F is a vertical cross-sectional view describing a step of the method of manufacturing the semiconductor device according to the embodiment.

Subsequently, as illustrated in FIG. 5F, $Al_2O_3$ (aluminum oxide) is deposited by using an ALD (Atomic Layer Deposition) method to form the gate insulating film 171. The ALD method makes it possible to form a uniform film on all the exposed regions. The gate insulating film 171 is thus formed as a uniform film on the exposed surfaces of the barrier layer 140, the first insulating layer 161, and the second insulating layer 162 including the inside of the gate opening 170H and the side surface opening 172H.

Figure 5G:
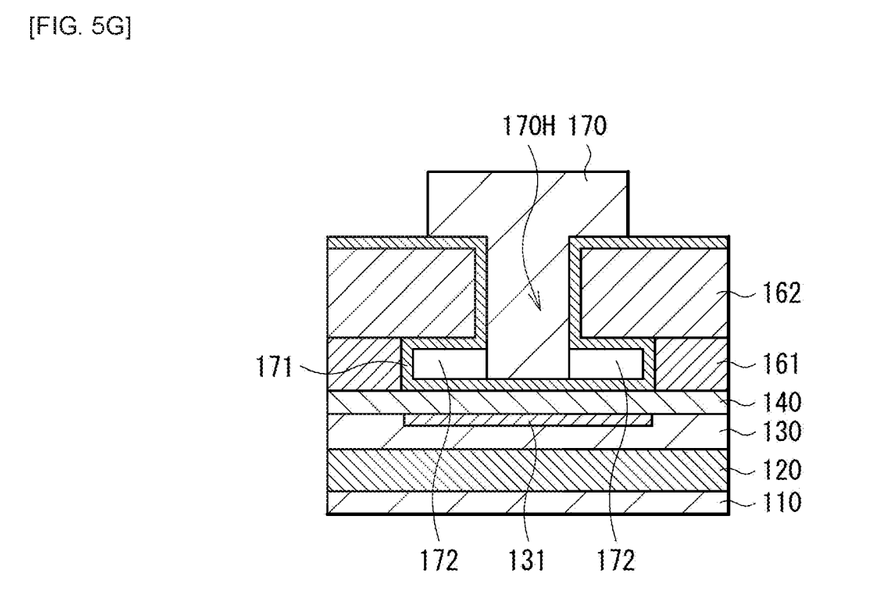
FIG. 5G is a vertical cross-sectional view describing a step of the method of manufacturing the semiconductor device according to the embodiment.

Next, as illustrated in FIG. 5G, Ni (nickel) and Au (gold) are sequentially deposited on the gate insulating film 171 to fill the gate opening 170H. This forms the gate electrode 170. After that, the third insulating layer 163 is deposited on the gate insulating film 171 and the source electrode 150S and the drain electrode 150D are then formed on the unillustrated ohmic layers 151 to make it possible to manufacture the semiconductor device 100 according to the present embodiment.

It is to be noted that the side surface opening regions 172 are gaps in the manufacturing method described above, but it is also possible to fill each of the side surface opening regions 172 with a low dielectric constant material. Specifically, it is possible to fill each of the side surface opening regions 172 with a low dielectric constant material by depositing the low dielectric constant material to fill the side surface opening 172H after the formation of the gate insulating film 171 and removing the low dielectric constant material deposited on the gate opening 170H with anisotropic etching or the like.

MODIFICATION EXAMPLE

Figure 6:
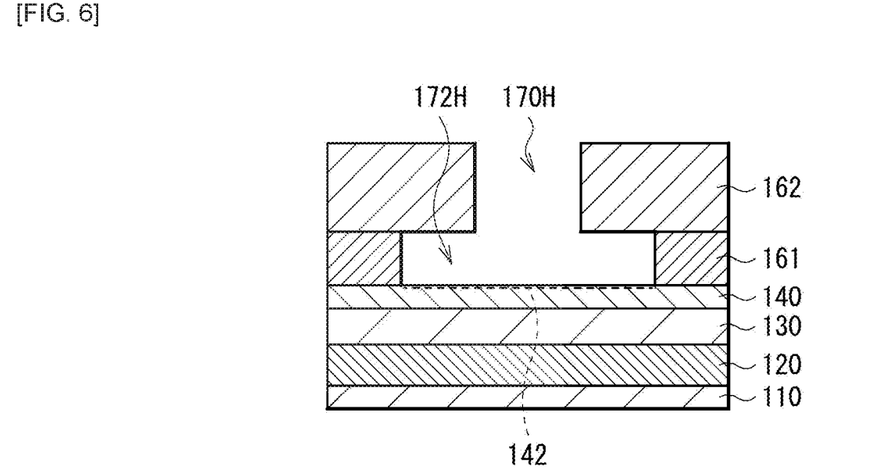
FIG. 6 is a vertical cross-sectional view describing a modification example of a method of forming the low-Ns region.
Figure 7A:
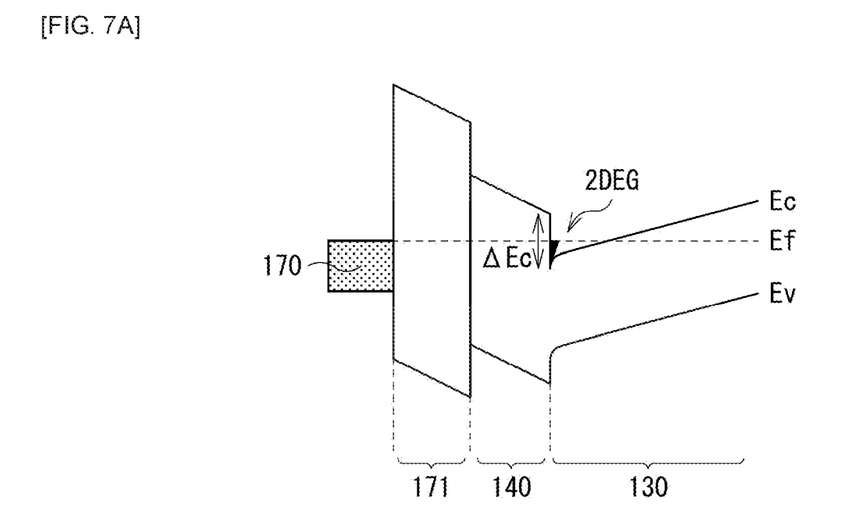
FIG. 7A is an energy band diagram of the semiconductor device in which fixed electric charge has not yet been applied to a barrier layer.
Figure 7B:
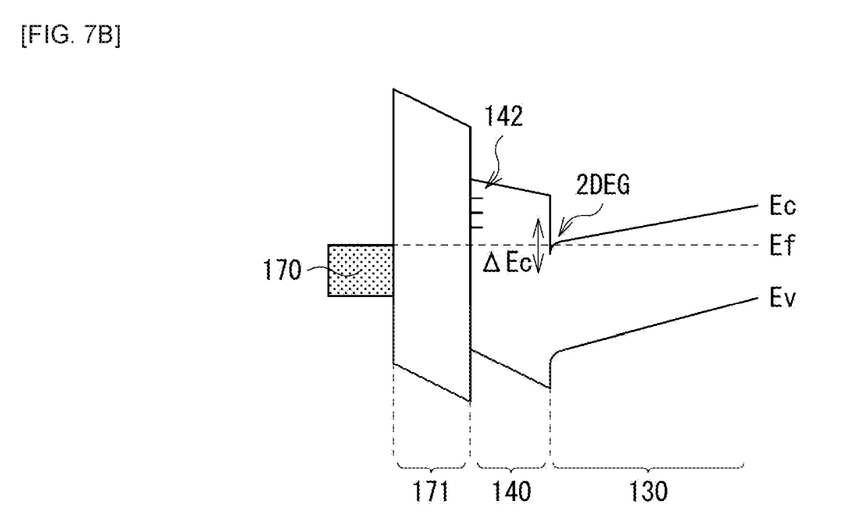
FIG. 7B is an energy band diagram of the semiconductor device in which the fixed electric charge has already been applied to the barrier layer.

It is also possible to form the low-Ns region 131 in a method other than the method described with reference to FIG. 5E. A modification example of the method of forming the low-Ns region 131 is described with reference to FIGS. 6, 7A, and 7B. FIG. 6 is a vertical cross-sectional view describing the modification example of the method of forming the low-Ns region 131. FIG. 7A is an energy band diagram of the semiconductor device 100 in which fixed electric charge has not yet been applied to the barrier layer 140. FIG. 7B is an energy band diagram of the semiconductor device 100 in which the fixed electric charge has already been applied to the barrier layer 140. It is to be noted that, in FIGS. 7A and 7B, Ec represents the energy level at the lower end of the conduction band, Ev represents the energy level at the upper end of the valence band, and Ef represents the Fermi level.

As illustrated in FIG. 6, it is possible to form the low-Ns region 131 in the channel layer 130 by performing oxidization treatment (i.e., ashing) on the barrier layer 140 exposed by the gate opening 170H and the side surface opening 172H with $N_2$ plasma or $O_2$ plasma and generating fixed electric charge 142 in the barrier layer 140.

Specifically, as indicated by a comparison between FIGS. 7A and 7B, the fixed electric charge 142 of the barrier layer 140 pushes up the energy band of the channel layer 130 and this decreases the carriers accumulated in the channel layer 130 as the two-dimensional electron gas layer (2DEG). This makes it possible to form the low-Ns region 131 having reduced carrier density in the channel layer 130 corresponding to the barrier layer 140 having the fixed electric charge 142 added thereto. It is therefore possible to form the low-Ns region 131 in the channel layer 130 corresponding to the barrier layer 140 exposed by the gate opening 170H and the side surface opening 172H.

In the method described above, it is possible to form the low-Ns region 131 with no mask or the like added because the low-Ns region 131 is formed in the channel layer 130 by using the gate opening 170H and the side surface opening 172H. It is to be noted that an end of the low-Ns region 131 may align with an end of the side surface opening 172H. Alternatively, an end of the low-Ns region 131 may extend outward from an end of the side surface opening 172H.

2. SECOND EMBODIMENT

Figure 8:
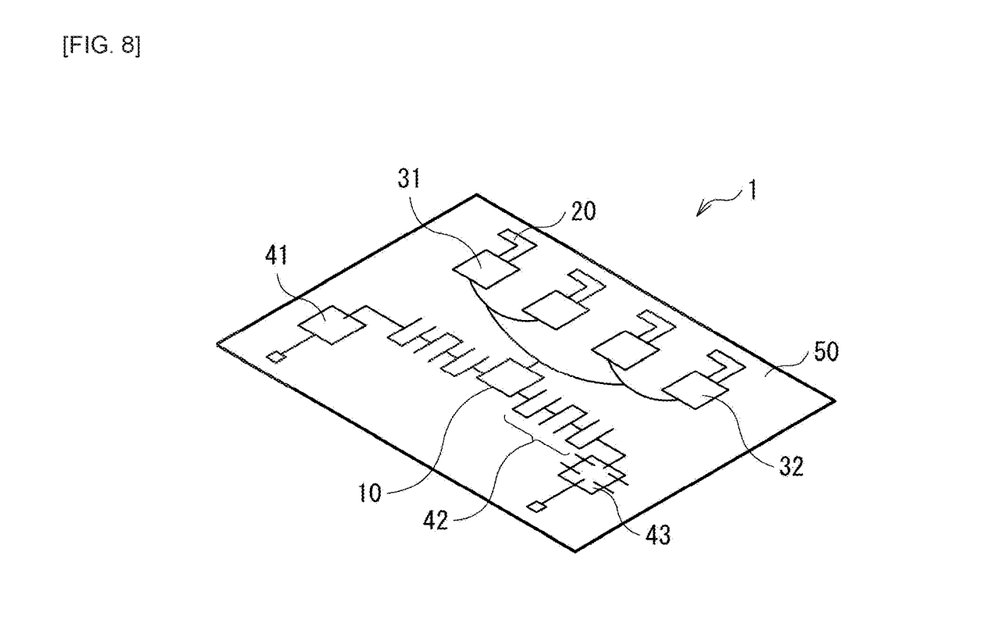
FIG. 8 is a schematic perspective view of a configuration of a semiconductor module according to a second embodiment of the present disclosure.

Subsequently, a semiconductor module according to a second embodiment of the present disclosure is described with reference to FIG. 8. FIG. 8 is a schematic perspective view of a configuration of a semiconductor module 1 according to the second embodiment of the present disclosure.

As illustrated in FIG. 8, the semiconductor module 1 according to the present embodiment is an antenna-integrated module in which, for example, array-shaped edge antennas 20 and front-end components are implemented as one module. The front-end components include a switch 10, a low-noise amplifier 41, a bandpass filter 42, a power amplifier 43, and the like. The semiconductor module 1 may be used, for example, as a transceiver for wireless communication.

The semiconductor module 1 includes, for example, the semiconductor device 100 according to the first embodiment as a transistor included in the switch 10, the low-noise amplifier 41, the power amplifier 43, or the like. For example, the fifth-generation mobile communication (5G), which uses radio waves in a higher frequency band, has a greater propagation loss of radio waves. The semiconductor module 1 supporting 5G is thus requested to transmit radio waves with higher power. The semiconductor module 1 including the semiconductor device 100 according to the first embodiment is allowed to have higher withstand voltage performance. It is therefore possible to perform wireless communication with high power, low power consumption, and high reliability. In other words, it is possible to use the semiconductor module 1 more favorably for the fifth-generation mobile communication (5G).

3. THIRD EMBODIMENT

Figure 9:
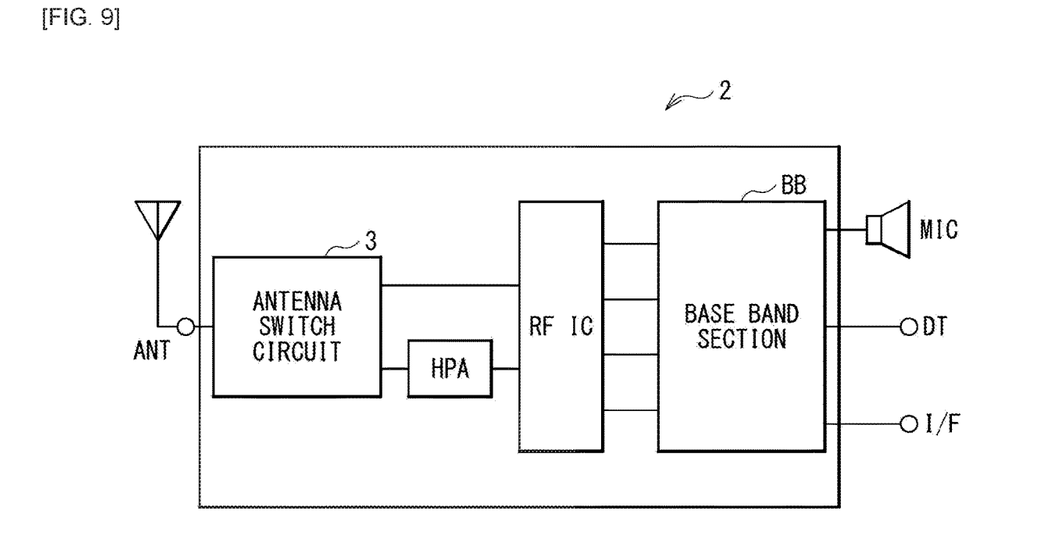
FIG. 9 is a block diagram illustrating a configuration of a wireless communication apparatus according to a third embodiment of the present disclosure.

Next, a wireless communication apparatus according to a third embodiment of the present disclosure is described with reference to FIG. 9. FIG. 9 is a block diagram illustrating a configuration of a wireless communication apparatus 2 according to the third embodiment of the present disclosure.

As illustrated in FIG. 9, the wireless communication apparatus 2 includes an antenna ANT, an antenna switch circuit 3, a high-power amplifier HPA, a radio frequency integrated circuit RFIC (Radio Frequency Integrated Circuit), a base band section BB, a sound output section MIC, a data output section DT, and an interface section I/F (e.g., wireless LAN (Wireless Local Area Network: W-LAN), Bluetooth (registered trademark), or the like). The wireless communication apparatus 2 is, for example, a mobile phone system having multiple functions including voice, data communication, LAN connection, and the like.

Upon transmission, the base band section BB in the wireless communication apparatus 2 outputs a transmission signal to the antenna ANT through the radio frequency integrated circuit RFIC, the high-power amplifier HPA, and the antenna switch circuit 3. In addition, upon reception, the antenna ANT in the wireless communication apparatus 2 inputs a reception signal to the base band section BB through the antenna switch circuit 3 and the radio frequency integrated circuit RFIC. The reception signal processed by the base band section BB is outputted, for example, from the sound output section MIC, the data output section DT, or the interface section I/F to the outside of the wireless communication apparatus 2.

The wireless communication apparatus 2 includes the semiconductor device 100 according to the first embodiment as a transistor included in the antenna switch circuit 3, the high-power amplifier HPA, the radio frequency integrated circuit RFIC, the base band section BB, or the like. This allows the wireless communication apparatus 2 to have higher withstand voltage performance. It is therefore possible to perform wireless communication with high power, low power consumption, and high reliability.

The technology according to the present disclosure has been described above with reference to the embodiments. However, the technology according to the present disclosure is not limited to the embodiments or the like described above. A variety of modifications are possible.

For example, in the embodiments described above, the example has been described in which the semiconductor device 100 includes a GaN-based compound semiconductor, but the technology according to the present disclosure is not limited to the example described above. For example, the semiconductor device 100 may include a GaAs-based compound semiconductor.

Further, not all of the components and operations described in the embodiments are necessary as the components and operations according to the present disclosure. For example, among the elements in the respective embodiments, elements not recited in an independent claim based on the most generic concept of the present disclosure are to be understood as optional components.

The terms used throughout this specification and the appended claims should be construed as "non-limiting" terms. For example, the term "including" or "included" should be construed as "not limited to what is described as being included". The term "having" should be construed as "not limited to what is described as having".

The terms used in this specification are used merely for the convenience of description and include terms that are not used to limit the configuration and the operation. For example, the terms such as "right", "left", "up", and "down" only indicate directions in the diagrams being referred to. In addition, the terms "inside" and "outside" only indicate a direction toward the center of a component of interest and a direction away from the center of a component of interest, respectively. The same applies to terms similar to these and terms with the similar purpose.

It is to be noted that the technology according to the present disclosure may have configurations as follows. The technology according to the present disclosure having the following configurations makes it possible to form the low-Ns region having reduced carrier density in the channel layer corresponding to the barrier layer exposed by the gate opening and the side surface opening regions. This allows the semiconductor device to reduce an electric field generated between the gate electrode and the channel layer by using the low-Ns region. It is therefore possible to further increase the gate withstand voltage. Effects attained by the technology according to the present disclosure are not necessarily limited to the effects described herein, but may include any of the effects described in the present disclosure.

(1)
A semiconductor device including:
  a channel layer including a first nitride semiconductor;
  a barrier layer including a second nitride semiconductor, the barrier layer being provided on the channel layer;
  a source electrode and a drain electrode that are provided above the barrier layer;
  a gate electrode that is provided above the barrier layer between the source electrode and the drain electrode;
  a side surface opening region that is at least provided on one of side surfaces of the gate electrode between the source electrode or the drain electrode and the gate electrode; and
  a low-Ns region that is provided in the channel layer in correspondence with a planar region provided with the gate electrode and the side surface opening region, the low-Ns region having lower carrier density than carrier density of another region of the channel layer.

(2)
The semiconductor device according to (1), in which the gate electrode is provided above the barrier layer with a gate insulating film interposed in between.

(3)
The semiconductor device according to (1) or (2), further including an insulating layer that fills a region between the gate electrode and the source electrode or the drain electrode, in which the side surface opening region is provided as a side surface opening of the insulating layer.

(4)
The semiconductor device according to any one of (1) to (3), in which the low-Ns region is provided in the channel layer immediately below the gate electrode and the side surface opening region.

(5)
The semiconductor device according to any one of (1) to (4), in which the carrier density of the low-Ns region is 50% or more and 90% or less of the carrier density of the other region of the channel layer.

(6)
The semiconductor device according to any one of (1) to (5), in which the side surface opening region is at least provided on the side surface of the gate electrode between the drain electrode and the gate electrode.

(7)
The semiconductor device according to (6), in which the respective side surface opening regions are provided on both of the side surfaces of the gate electrode between the source electrode and the drain electrode, and the gate electrode.

(8)
The semiconductor device according to (7), in which a size of the side surface opening region provided between the drain electrode and the gate electrode is larger than a size of the side surface opening region provided between the source electrode and the gate electrode.

(9)
The semiconductor device according to any one of (1) to (8), in which the side surface opening region is provided over an entire circumference of the side surfaces of the gate electrode.

(10)
The semiconductor device according to any one of (1) to (9), in which the side surface opening region is provided to have a width of 100 nm or less from the gate electrode.

(11)
The semiconductor device according to any one of (1) to (10), in which the barrier layer includes AlInN as the second nitride semiconductor.

(12)
A semiconductor module including
a semiconductor device, in which
the semiconductor device includes
  a channel layer including a first nitride semiconductor,
  a barrier layer including a second nitride semiconductor, the barrier layer being provided on the channel layer,
  a source electrode and a drain electrode that are provided above the barrier layer,
  a gate electrode that is provided above the barrier layer between the source electrode and the drain electrode,
  a side surface opening region that is at least provided on one of side surfaces of the gate electrode between the source electrode or the drain electrode and the gate electrode, and
  a low-Ns region that is at least provided in the channel layer corresponding to a planar region provided with the gate electrode and the side surface opening region, the low-Ns region having lower carrier density than carrier density of another region of the channel layer.

(13)
A wireless communication apparatus including
a semiconductor device, in which
the semiconductor device includes
  a channel layer including a first nitride semiconductor,
  a barrier layer including a second nitride semiconductor, the barrier layer being provided on the channel layer,
  a source electrode and a drain electrode that are provided above the barrier layer,
  a gate electrode that is provided above the barrier layer between the source electrode and the drain electrode,
  a side surface opening region that is at least provided on one of side surfaces of the gate electrode between the source electrode or the drain electrode and the gate electrode, and
  a low-Ns region that is at least provided in the channel layer corresponding to a planar region provided with the gate electrode and the side surface opening region, the low-Ns region having lower carrier density than carrier density of another region of the channel layer.

This application claims the priority on the basis of Japanese Patent Application No. 2020-123446 filed with Japan Patent Office on Jul. 20, 2020, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
a channel layer including a first nitride semiconductor;
a barrier layer including a second nitride semiconductor, the barrier layer being provided on the channel layer;
a source electrode and a drain electrode that are provided above the barrier layer;
a gate electrode that is provided above the barrier layer between the source electrode and the drain electrode;
a side surface opening region that is provided on at least one of side surfaces of the gate electrode between the source electrode or the drain electrode and the gate electrode; and
a low-Ns region that is provided in the channel layer in correspondence with a planar region provided with the gate electrode and the side surface opening region, the low-Ns region having lower carrier density than carrier density of another region of the channel layer.

2. The semiconductor device according to claim 1, wherein the gate electrode is provided above the barrier layer with a gate insulating film interposed in between.

3. The semiconductor device according to claim 1, further comprising an insulating layer that fills a region between the gate electrode and the source electrode or the drain electrode, wherein
the side surface opening region is provided as a side surface opening of the insulating layer.

4. The semiconductor device according to claim 1, wherein the low-Ns region is provided in the channel layer immediately below the gate electrode and the side surface opening region.

5. The semiconductor device according to claim 1, wherein the carrier density of the low-Ns region is 50% or more and 90% or less of the carrier density of the other region of the channel layer.

6. The semiconductor device according to claim 1, wherein the side surface opening region is at least provided on the side surface of the gate electrode between the drain electrode and the gate electrode.

7. The semiconductor device according to claim 6, wherein the respective side surface opening regions are provided on both of the side surfaces of the gate electrode between the source electrode and the drain electrode, and the gate electrode.

8. The semiconductor device according to claim 7, wherein a size of the side surface opening region provided between the drain electrode and the gate electrode is larger than a size of the side surface opening region provided between the source electrode and the gate electrode.

9. The semiconductor device according to claim 1, wherein the side surface opening region is provided over an entire circumference of the side surfaces of the gate electrode.

10. The semiconductor device according to claim 1, wherein the side surface opening region is provided to have a width of 100 nm or less from the gate electrode.

11. The semiconductor device according to claim 1, wherein the barrier layer includes AlInN as the second nitride semiconductor.

12. A semiconductor module comprising
a semiconductor device, wherein
the semiconductor device includes
a channel layer including a first nitride semiconductor,
a barrier layer including a second nitride semiconductor, the barrier layer being provided on the channel layer,
a source electrode and a drain electrode that are provided above the barrier layer,
a gate electrode that is provided above the barrier layer between the source electrode and the drain electrode,
a side surface opening region that is at least provided on one of side surfaces of the gate electrode between the source electrode or the drain electrode and the gate electrode, and
a low-Ns region that is at least provided in the channel layer corresponding to a planar region provided with the gate electrode and the side surface opening region, the low-Ns region having lower carrier density than carrier density of another region of the channel layer.

13. A wireless communication apparatus comprising
a semiconductor device, wherein
the semiconductor device includes
a channel layer including a first nitride semiconductor,
a barrier layer including a second nitride semiconductor, the barrier layer being provided on the channel layer,
a source electrode and a drain electrode that are provided above the barrier layer,
a gate electrode that is provided above the barrier layer between the source electrode and the drain electrode,
a side surface opening region that is at least provided on one of side surfaces of the gate electrode between the source electrode or the drain electrode and the gate electrode, and
a low-Ns region that is at least provided in the channel layer corresponding to a planar region provided with the gate electrode and the side surface opening region, the low-Ns region having lower carrier density than carrier density of another region of the channel layer.

* * * * *